(12) United States Patent
Lu et al.

(10) Patent No.: US 11,201,184 B1
(45) Date of Patent: Dec. 14, 2021

(54) IMAGE SENSING DEVICES WITH REFLECTOR ARRAYS

(71) Applicant: Shenzhen Adaps Photonics Technology Co. LTD., Shenzhen (CN)

(72) Inventors: Ching-Jui Lu, Shenzhen (CN); Ching-Ying Lu, Shenzhen (CN); Shuang Li, Shenzhen (CN)

(73) Assignee: Shenzhen Adaps Photonics Technology Co. LTD., Shenzhen (CN)

( * ) Notice: Subject to any disclaimer, the term of this patent is extended or adjusted under 35 U.S.C. 154(b) by 0 days.

(21) Appl. No.: 17/240,522

(22) Filed: Apr. 26, 2021

Related U.S. Application Data (63) Continuation of application No. 17/033,052, filed on Sep. 25, 2020.

(51) Int. Cl.
| | | |
|---|---|---|
| *G01C 3/08* | (2006.01) | |
| *H01L 27/146* | (2006.01) | |
| *G01S 7/481* | (2006.01) | |
| *G01S 17/89* | (2020.01) | |
| *H01L 31/107* | (2006.01) | |

(52) U.S. Cl.
CPC ........ *H01L 27/1463* (2013.01); *G01S 7/4816* (2013.01); *G01S 17/89* (2013.01); *H01L 27/14627* (2013.01); *H01L 27/14629* (2013.01); *H01L 31/107* (2013.01)

(58) Field of Classification Search
CPC .......... H01L 27/1463; H01L 27/14627; H01L 27/14629; H01L 31/107; G01S 7/4816; G01S 17/89
USPC .................................................. 356/401, 4.01
See application file for complete search history.

(56) References Cited

U.S. PATENT DOCUMENTS

| | | | | |
|---|---|---|---|---|
| 8,885,987 B2* | 11/2014 | Augusto | .............. | G02B 6/1225 385/14 |
| 2013/0320459 A1* | 12/2013 | Shue | ..................... | H01L 27/088 257/392 |
| 2018/0190698 A1* | 7/2018 | Na | ..................... | H01L 27/14636 |
| 2018/0247968 A1* | 8/2018 | Na | ......................... | G01S 7/4914 |
| 2019/0006548 A1* | 1/2019 | Wei | .................... | H01L 31/02164 |

\* cited by examiner

*Primary Examiner* — Georgia Y Epps
*Assistant Examiner* — Kevin Wyatt (57) ABSTRACT

The present invention relates generally to sensing devices. In an embodiment, the present invention provides a SPAD pixel that includes a first region and a second region. An absorption region is configured within the first region. A first reflector array is configured within the second region and below the absorption region. A second reflector array is configured within the second region and below the first reflector array. The SPAD pixel also includes isolation structures configured within the first region.

18 Claims, 11 Drawing Sheets

Light path more linear; more detours, more probability of absorption

IMAGE SENSING DEVICES WITH REFLECTOR ARRAYS

1. CROSS-REFERENCES TO RELATED APPLICATIONS

The present invention is a continuation of U.S. patent application Ser. No. 17/033,052 filed Sep. 25, 2020. This application is also related to U.S. patent application Ser. No. 16/775,101, entitled "SINGLE PHOTON AVALANCE DIODE DEVICE", filled on Jan. 28, 2020, which is commonly owned and incorporated by reference herein for all purposes.

BACKGROUND OF THE INVENTION

The present invention relates generally to sensing devices.

Research and development in integrated microelectronics have continued to produce astounding progress with sensor devices. Many examples of photo diodes exist. For example, a photodiode is a p-n junction or PIN structure. When a photon of sufficient energy strikes the diode, it creates an electron-hole pair. This mechanism is also known as the inner photoelectric effect. If the absorption occurs in the junction's depletion region, or one diffusion length away from it, these carriers are swept from the junction by the built-in electric field of the depletion region. Thus, as holes move toward the anode (electrons move toward the cathode), a photocurrent is produced. The total current through the photodiode is the sum of the dark current (current that is generated in the absence of light) and the photocurrent, so the dark current must be minimized to maximize the sensitivity of the device.

Another example of a photo diode is called an "avalanche photodiode". The avalanche photodiodes are photodiodes with structure optimized for operating with high reverse bias, approaching the reverse breakdown voltage. This allows each photo-generated carrier to be multiplied by avalanche breakdown, resulting in internal gain within the photodiode, which increases the effective sensitivity of the device. A type of photo diode—usually referred to as single photon avalanche diode (SPAD) device—has been gaining popularity and used in a variety of applications, such as LIDAR system that have becoming a mainstream component of consumer electronics, automobiles, and other applications.

Among other reasons, existing SPAD devices and systems thereof have been inadequate for the reasons provided below. New and improved SPAD devices are desired.

BRIEF SUMMARY OF THE INVENTION

The present invention relates generally to sensing devices. In an embodiment, the present invention provides a SPAD pixel that includes a first region and a second region. A absorption region is configured within the first region. A first reflector array is configured within the second region and below the absorption region. A second reflector array is configured within the second region and below the first reflector array. The SPAD pixel also includes isolation structures configured within the first region. There are other embodiments as well.

According to an embodiment, the present invention provides an image pixel circuit, which includes a first semiconductor region. The circuit also includes a second semiconductor region overlaying the first semiconductor region. The circuit further includes a microlens overlaying the second semiconductor region. The circuit also includes a first isolation structure positioned within the second semiconductor region. The circuit additionally includes a second isolation structure positioned within the second semiconductor region. The second isolation structure is aligned relative to the first isolation structure in a first direction. The circuit additionally includes an absorption region positioned within the second semiconductor region and overlaying the first semiconductor region. The circuit further includes a first plurality of reflectors positioned within the first semiconductor region. The circuit additionally includes a second plurality of reflectors positioned between the first plurality of reflectors and the absorption region.

According to another embodiment, the present invention provides an image sensor module, which includes a control circuit. The module also includes a SPAD pixel array configured to generate imaging data based on detected photons. The SPAD pixel array includes a first pixel and a second pixel. The first pixel includes a first isolation structure and a second isolation structure. The second pixel includes the second isolation structure and a third isolation structure. The first pixel includes an oxide region and an absorption region overlaying the oxide region. The oxide region includes a first reflector array and a second reflector array. The first reflector array is positioned between the absorption region and the second reflector array. The module further includes a memory for storing the imaging data.

According to yet another embodiment, the present invention provides a LIDAR system, which includes a light source configured to generate a patterned light at a predetermined wavelength. The system also includes a control circuit. The system further includes a SPAD pixel array configured to generate imaging data based on detected photons. The detected photons being associated with the patterned light. The SPAD pixel array includes m by n pixels, where m and n are integers greater than 30. The m by n pixels includes a first pixel. The first pixel includes a first isolation structure and a second isolation structure. The first pixel includes an oxide region and an absorption region overlaying the oxide region. The oxide region includes a first reflector array and a second reflector array. The first reflector array is positioned between the absorption region and the second reflector array. The system further includes a memory for storing the imaging data.

It is to be appreciated that embodiments of the present invention provide many advantages over conventional techniques. Among other things, reflector arrays layers implemented according to embodiments of the present invention improve photon detection and reduces undesirable crosstalk of SPAD pixels. For example, a SPAD sensor implemented using SPAD pixels according to embodiments of the present invention can achieve a high level of performance, as measured in terms of signal to noise ratio, sensitivity, low error rate, and other metrics. There are other benefits as well.

Embodiments of the present invention can be implemented in conjunction with existing systems and processes. For example, SPAD pixels according to embodiments of the present invention can be manufactured using existing semiconductor processes. Additionally, SPAD pixel design, image sensors, and LIDAR systems described herein can be used in a wide range of applications, and various implementations are compatible with existing technology.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

The present invention relates generally to sensing devices. In an embodiment, the present invention provides a SPAD pixel that includes a first region and a second region. A absorption region is configured within the first region. A first reflector array is configured within the second region and below the absorption region. A second reflector array is configured within the second region and below the first reflector array. The SPAD pixel also includes isolation structures configured within the first region.

As explained above, SPAD devices and systems have been popular for a variety of applications. Unfortunately, existing SPAD architectures and designs often do not have sufficient sensitivity—often measured by signal-to-noise ratio (SNR)—for the received photons. A SPAD pixel of a SPAD sensor array includes, among other components, a reversed biased p-n junction (or sometimes referred to as a photodiode) that can be illuminated by a single photon—a single photon can trigger an avalanche current and hence the name—at a certain spectrum (e.g., the infrared spectrum with a wavelength of about 800 to 1000 nm is often used in LIDAR applications). As an example, "SPAD pixel" refers to a SPAD device with a single p-n junction for photon detection; "SPAD sensor array" refers to an array of m by n-m and n usually over a hundred—SPAD pixels. The p-n junction is typically implemented using doped silicon material (e.g., manufactured with CMOS processes), which is sometimes penetrated—as opposed to being illuminated that allows photon detection—by photons. And these photons, in addition to escaping the detection of the p-n injunction that they penetrate, may additionally travel to another SPAD pixel of the SPAD sensor array and trigger undesirable and erroneous detection by a different p-n junction. It is therefore to be appreciated that embodiments of the present invention provide SPAD pixel architectures that include both isolation elements and reflector elements (i.e., reflector arrays) that increase the probability of photons being detected by the target SPAD pixel (i.e., its p-n junction or photodiode) and reduce the probability of photons being detected by the non-target SPAD pixels, thereby improving performance.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Figure 1A:
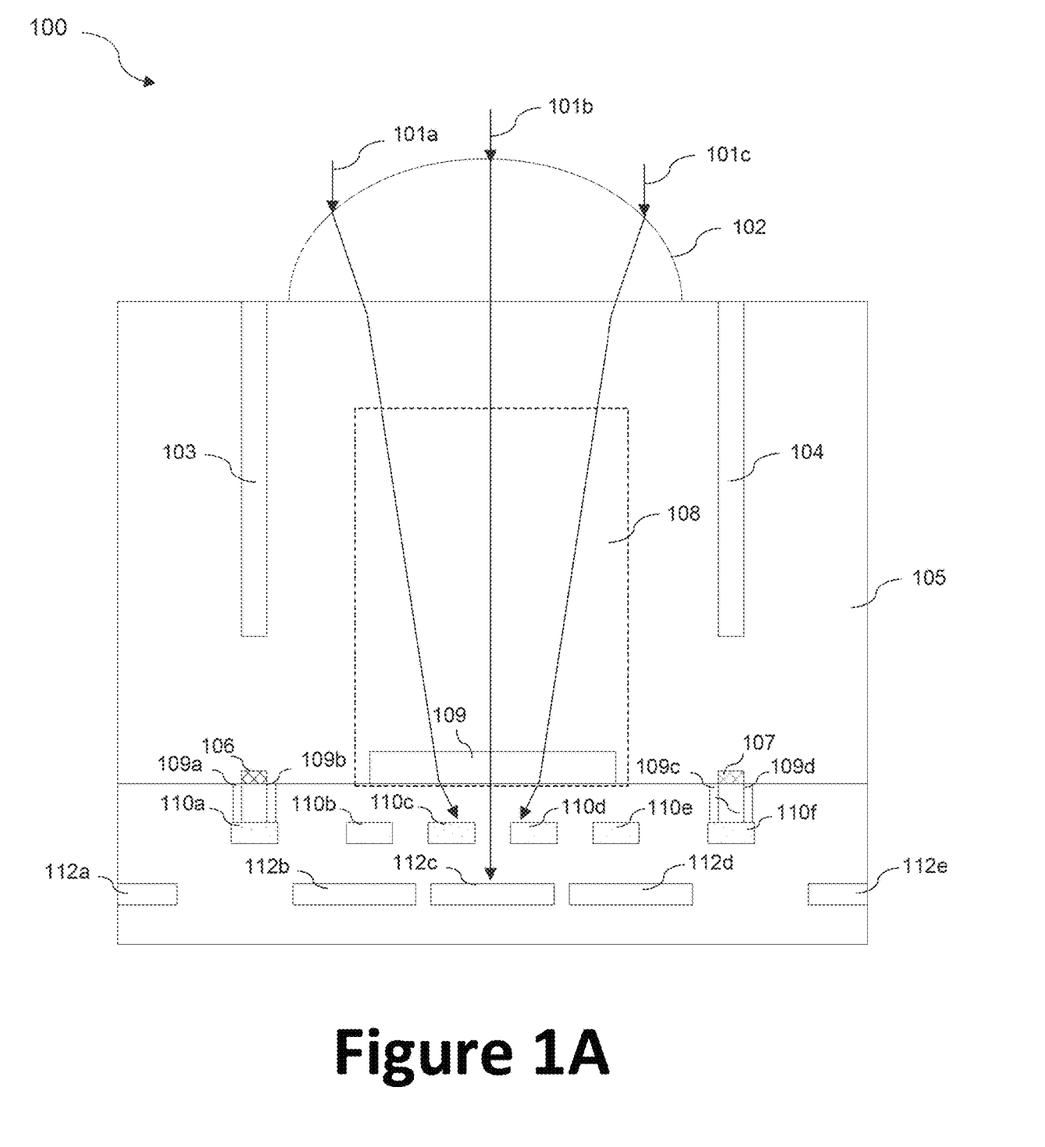
FIG. 1A is a simplified side view diagram illustrating SPAD pixel 100 according to embodiments of the present invention.

FIG. 1A is a simplified sideview diagram illustrating SPAD pixel 100 according to an embodiment of the present invention. This diagram is merely an example, which should not unduly limit the scope of the claims. One of ordinary skill in the art would recognize many variations, alternatives, and modifications. A SPAD pixel array includes m by n SPAD pixels, and one of these SPAD pixels is SPAD pixel 100. In a LIDAR (or other types of imaging) system, imaging resolution depends on the number of pixels and the sensitivity of these pixels. Currently, both m and n are in the low hundreds, but m and n can go up to thousands of even millions in the future. For a given image sensor size, high pixel count means smaller pixel area. An important aspect of image sensor design is to maintain pixel sensitivity as pixel area decreases. In various embodiments, the SPAD pixel array is a part of a LIDAR system; the SPAD pixel array is connected to a control circuit and memory buffer, and together they form the image sensor of the LIDAR system. For example, the control circuit controls the readout rate of the SPAD pixel array and stores the readout to the memory buffer. The LIDAR system also includes a laser light source that emits light at a wavelength (e.g., infrared) that is optimized for detection by the SPAD pixel array. For example, the control circuit can be configured to coordinate emission by the laser light source and the image sensor. In various implementations, the LIDAR system is able generate depth map using time-of-flight information.

As an example, SPAD pixel 100 is surrounded by other SPAD pixels. Among other things, SPAD pixel 100 includes a silicon region 105, an oxide region 113 (i.e., comprising silicon oxide material), and a substrate (not shown in FIG. 1A) underlying the oxide region 113. For example, electrical interconnects are configured with in the substrate. In various embodiments, the top surface of silicon region 105, which interfaces with microlens 102, is planarized and optimized for optical transmission. The active region of SPAD pixel 100 is defined between isolation structures 103 and 104, which are configured within silicon region 105.

In an example, SPAD pixel 100 includes a passivation material (not shown in FIG. 1A). In an example, the passivation material (which can be formed as layers) includes an oxide material, a high-K dielectric material, a nitride material, or a polyimide material, combinations thereof, and the like. In various implementations, passivation material comprises multiple layers. In an example, each of the pixel elements is formed on an epitaxially grown silicon material. The epitaxially grown silicon material can be formed using an epitaxial reactor using silicon-based precursor gases. As shown, a thickness of epitaxial material is made of a suitable thickness and is grown using a high temperature growth technique, among others. In an example, the epitaxial material is a monocrystalline silicon material, which is substantially defect free. For example, the passivation material is configured as a top layer between the silicon region 105 and the microlens 102. In various embodiments, SPAD pixel 100 includes a layer of anti-reflective material (not shown) positioned within region 105 and interfacing with microlens 102. In an example, the anti-reflective layer can be any optical material, such as an oxide, a nitride, or metal oxides, or other suitable materials, or combinations thereof, or the like.

In various embodiments, isolation structures 103 and 104 comprise deep trench structures that serve as borders of SPAD pixel 100. In various embodiments, isolation structures 103 and 104 comprise matte surfaces that are conducive to photons being scattered and reflected (hopefully onto the absorption region 108). For example, FIG. 1A shows a sideview of SPAD pixel 100 with two isolation structures, and top view of SPAD pixel 100 (shown in FIG. 1B) shows four isolation structures forming four "walls" of the pixel. In an example, isolation structure 103 comprises a fill material, a surrounding charge material, and a surrounding insulating material. In various embodiments, isolation structure 103 comprises a deep trench isolation (DTI) structure, which can be formed by etching and filling processes.

Figure 1B:
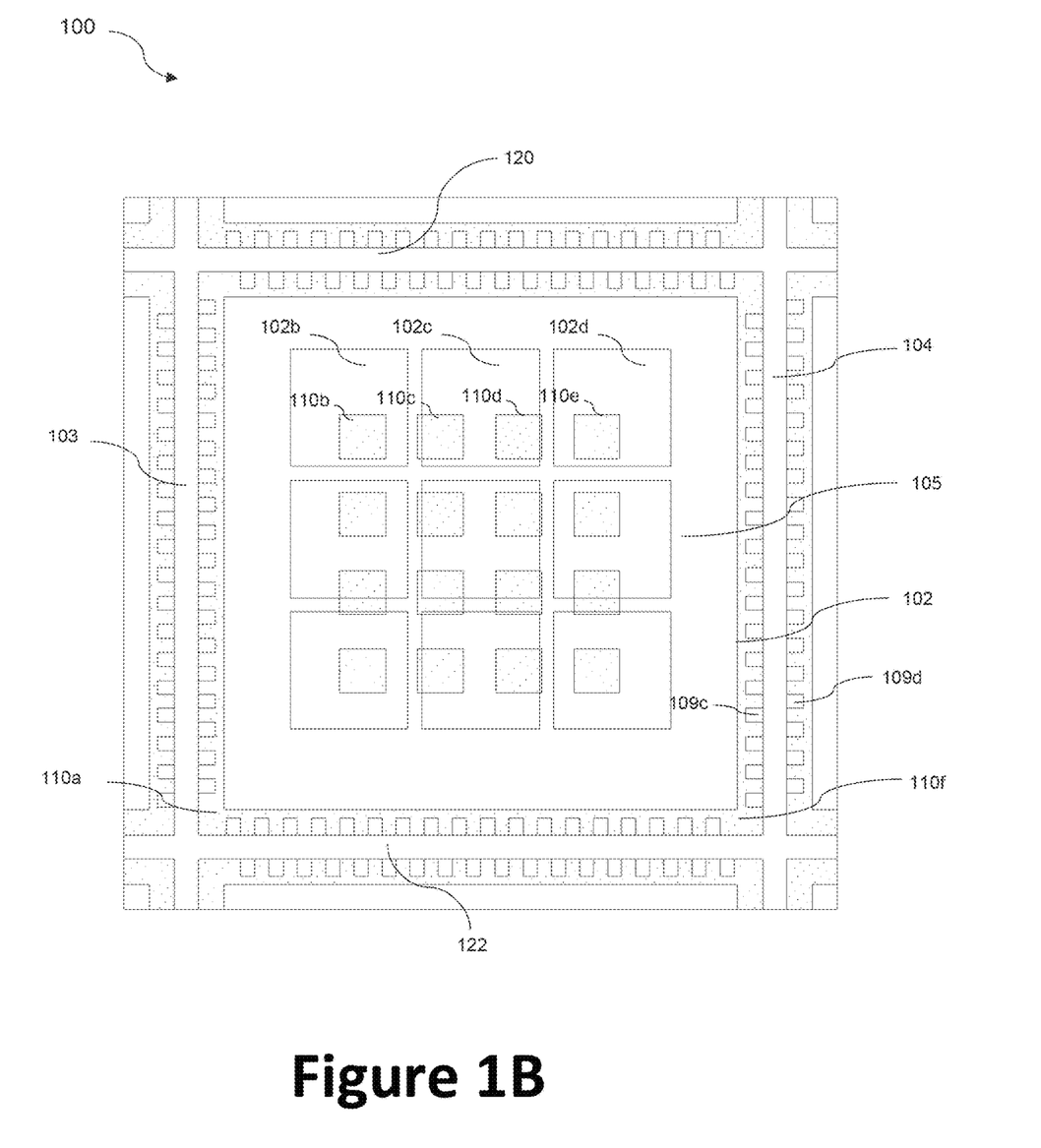
FIG. 1B is a simplified top view diagram illustrating SPAD pixel 100 according to embodiments of the present invention.
Figure 1C:
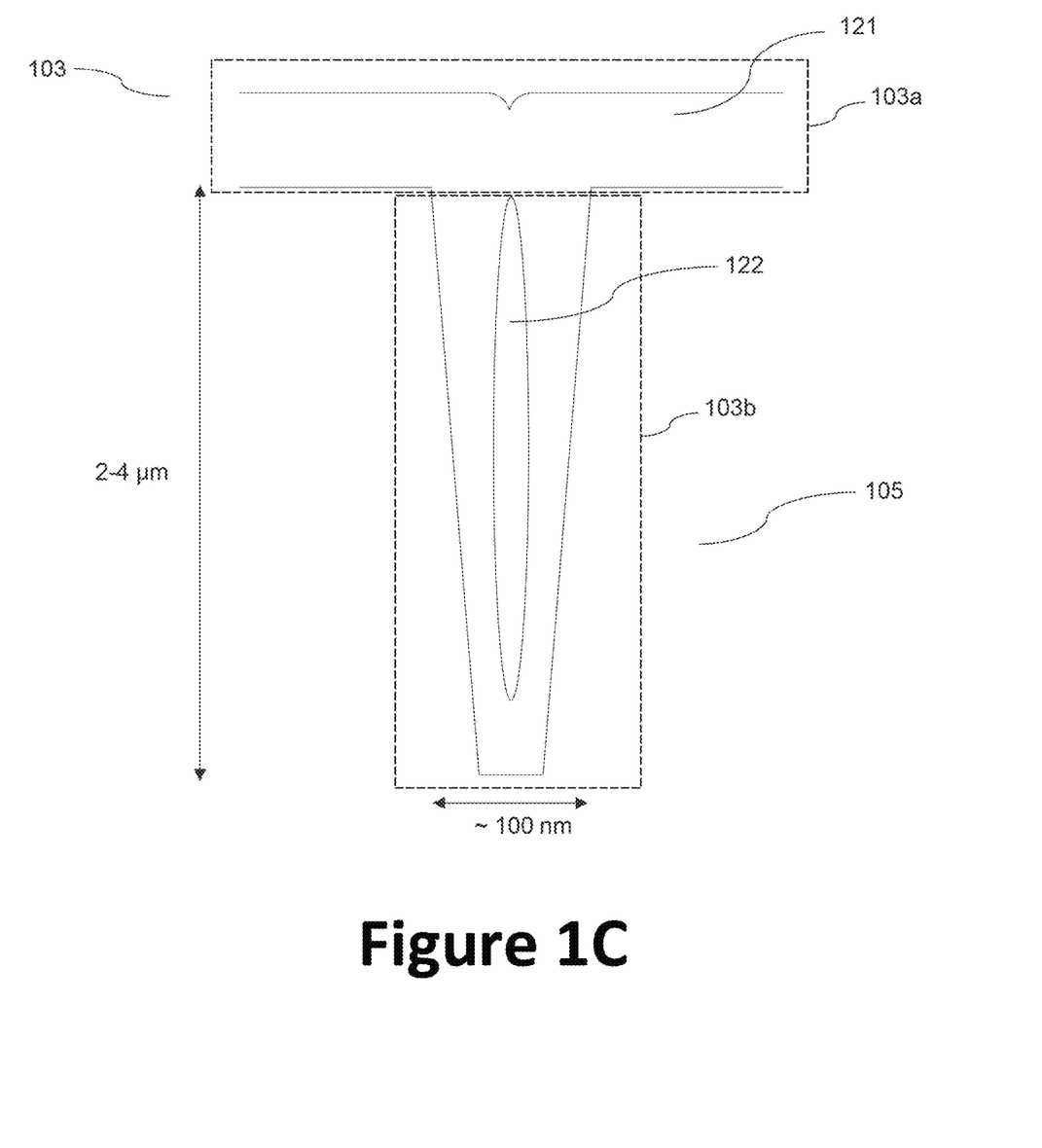
FIG. 1C is a simplified diagram illustrating a DTI structure according to embodiment of the present invention.

FIG. 1C is a simplified diagram illustrating a DTI structure according to embodiment of the present invention. This diagram is merely an example, which should not unduly limit the scope of the claims. One of ordinary skill in the art would recognize many variations, alternatives, and modifications. In an example, the fill material comprises a metal material, a semiconductor material, an insulating material, or air gap. In a preferred example, the fill material is a metal material to prevent cross-talk (i.e., photons entering SPAD pixel 100 traveling to an adjacent SPAD pixel), although the fill material can also be an insulating material, such as oxide material. In various embodiment, isolation structure 103 comprises insulating material 121 and filling material 122. For example, insulating material 121 may include oxide material interfacing silicon region 105. From the side view, isolation structure 103 comprises a top portion 103a and a bottom portion 103b. In various embodiments, the top portion 103a forms corners with bottom portion 103b, and these corners help trap photons within SPAD pixel 100. It is to be noted that the bottom portion 103b is wider on top and tapers down toward the bottom, creating angled sidewalls. In various implementations, the sidewall angle can be 5 to 10 degrees. For example, the angled sidewalls optimize photon reflection and direct the reflected photons toward the absorption region and minimize crosstalk. In various embodiment, sidewall surfaces are in matte finish to allow for optimized light reflection and trapping. For example, matte finish cause photon to scatter within SPAD pixel 100. In an example, the surrounding charge material is a high-K dielectric material. In an example, the surrounding insulating material includes an oxide or a nitride material, among others. In an example, the charge material configured at a deep trench isolation structure has a negative charge. In an example, high-K dielectric material, such as $Al_2O_3$ deposited by atomic layer deposition techniques forms negative fixed charge at an $SiO_2/Al_2O_3$ interface region. In an example, the negative fixed charge creates a positive flat band voltage shift, which causes semiconductor material near the deep trench isolation sidewall in accumulation mode rather than in a depletion mode. Additionally, spatially excluding the deep trench isolation sidewall interface from the depletion region greatly reduces chances for the interface defects to drift to the avalanche region. Accordingly, noise or the dark count rate can be greatly reduced.

Now referring back to FIG. 1A. In addition to the isolation structures 103 and 104, SPAD pixel 100 further includes isolation structures 106 and 107. For example, isolation structures 106 and 107 comprise shallow trench isolation (STI) structures, which may include oxide material as a filler. In various embodiments, isolation structures 106 and 107 can be manufactured using existing CMOS STI processes. For example, trenches are formed by an etching process followed by oxidation and filling of oxide. In various embodiments, isolation structures 106 and 107 are aligned against isolation structures 103 and 104. In addition to providing boundaries for SPAD pixel 100, isolation structures 103 and 104 and prevents—to a lesser extent compared to isolation structures 103 and 104—undesirable crosstalk between SPAD pixel 100 and its adjacent pixels. Contact holes 109a-109d are configured around the isolation structures 103 and 104 as shown. In a specific embodiment, contact holes are about 0.9 µm by 0.9 µm. It is to be understood that contact holes 109a-109d as shown do not necessary provide contacts (e.g., electrical contact regions), but they are formed during a semiconductor manufacturing process that is referred to as contact hole formation. Contact holes 109a-109d provide photon trapping (within the SPAD pixel) and prevent undesirable crosstalk. In various embodiments, contact holes comprise tungsten material, which provides a high level of conformality and a low level of resistivity. For example, tungsten material may have a low reflectivity associated with infrared light.

SPAD pixel 100 includes absorption region 108 that is specifically configured to detect photons. For example, absorption region 108 is configured as a photodiode. In various implementations, absorption region 108 comprises a portion of p-type material (as configured on top of a portion of implanted n-type material 109. In various embodiments, silicon region 105 comprises p-type material, and a p-n junction is formed between the p-type material in region 105 and the n-type material 109. In various embodiments, absorption region 108 comprises epitaxially grown material. In an example, the implanted p-type material comprises a boron material having a concentration density of 1E15 atoms/cm$^3$ to 1E18 atoms/cm$^3$. In an example, the implanted n-type material comprises a phosphorous entity or an arsenic entity having a concentration density of 1E17 atoms/cm$^3$ to 1E19 atoms/cm$^3$. Of course, there can be other variations, modifications, and alternatives. As shown, the implanted p-type material and the implanted n-type material are configured within a vicinity of the semiconductor substrate of the pixel element or near the bonding region, as shown. In various embodiments, absorption region 108 is coupled to metal contacts. In certain embodiments, absorption region 108 includes nano structures configured within a vicinity of the interface between absorption region 108 and region 113. For example, the nano structures facilitate trapping of a photon coming in contact with the nano structures.

In an example, light trapping works by coupling incoming photons into a lateral waveguide mode that increases absorption length. In an example, nano structures are formed using a periodic pattern (or can also be unpatterned in other examples) made by using a dry etching or selective wet etching of a silicon bearing material. In an example, dry etching of silicon bearing material causes formation of rectangular, or circular, or hexagonal shapes, or other shapes, of holes or openings. In an example, for silicon, the period of the nano-structures can be in the range of 650-850 nm, and a diameter of the nano-holes or openings can be in the range of 400-600 nm, although there can be other variations. In an example, to be compatible with CMOS STI (shallow trench isolation) processes, the depth of nano structures can be in the range of 300-450 nm, but can be others. After dry etching, the nano holes are oxidized and filled with an oxide fill material.

In an example, nano structures can also be made by a selective wet etching process. In an example, selective wet etching creates an inverse pyramid of holes or openings as shown. In an example, the period of the inverse pyramid can be in the range of 700-900 nm, among others. In an example, the depth of the inverse pyramid depends on the period of the pyramid because of a fixed angle of pyramid resulted from crystal direction. After wet etching, the pyramids are also oxidized and filled with oxide fill material. Further details of the present nanostructure configuration can be found throughout the present specification.

The detection of photons by absorption region 108 requires that photons illuminating on SPAD pixel 100 reach absorption region 108. Various embodiments of the present invention rely on one or more of the four mechanism that direct photons toward absorption region 108: microlens 102, isolation structures 103 and 104 (e.g., implemented with DTI), isolation structures 106 and 107 (e.g., implemented with STI), and reflector arrays (e.g., the first reflector array 110a-f and the second reflector array 112a-e shown in FIG. 1A). More specifically, microlens 102, configured on top of SPAD pixel 100, directs and focus light and photons onto absorption region 108. Isolation structures 103 and 104 further reflect photons—those that are already not on the path to absorption region 108—toward absorption region 108. Isolation structures 106 and 107 prevent photons from traveling to adjacent SPAD pixels by reflecting them back to the confine for SPAD pixel 100. Reflector arrays reflect photons that penetrate absorption region 108 without detection back to absorption region 108.

According to a specific embodiment, reflectors 110a-f are each about 1000 nm wide and separated from each other by a spacing of about 300 nm, and reflectors 112a-e are each about 4000 nm wide and separated from each other by a spacing of about 500 nm. In another embodiment, the reflectors 110a-f are each about 300 nm wide and separated from each other by a spacing of about 1000 nm.

Figure 1D:
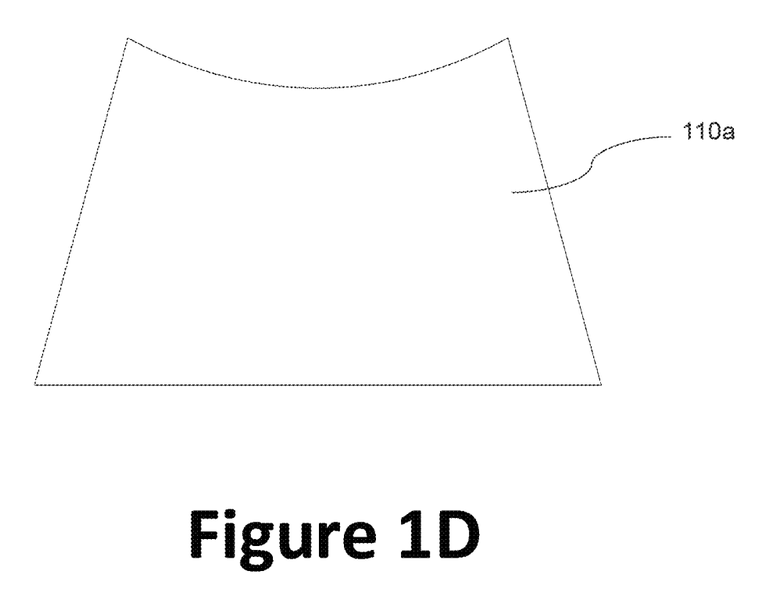
FIG. 1D is a simplified diagram illustrating reflector 110a according to an embodiment of the present invention.

In FIG. 1A, reflectors are shown s rectangular blocks for the simplicity of illustration. In various implementations, reflectors are in irregular shapes to maximize reflection. FIG. 1D is a simplified diagram illustrating reflector 110a according to an embodiment of the present invention. For example, reflector 110a provides an example of reflector shape for the first and second reflector arrays. Reflector 110a, as shown, includes a non-flat top surface and angled sidewalls, both of which are optimized for light reflection. In various embodiments, reflector 110a includes matte surfaces that increase light reflection and scattering.

Now referring back to FIG. 1A. SPAD pixel 100, as shown, includes microlens 102 that directs photons toward absorption region 108. Among other things, microlens 102 reduces undesirable optical cross talk and improves the fill factor for absorption region 108. For example, microlens 102 is manufactured using as a wafer-level optics (WLO). Microlens 102 includes a flat side and a convex side. The flat side interfaces with the top side of SPAD pixel 100 (or its passivation layer, not shown in FIG. 1). The convex side is configured with a specific curvature that is optimized based on the size and distance of absorption region 108. For example, a photon traveling through light path 101a or 101c at the angles shown—without the help of microlens 102—is likely to miss the absorption region 108 region; with the aid of microlens 102, photons illuminating the convex surface of microlens 102 are collimated toward the absorption region 108. In FIG. 1, light paths 101a, 101b, and 101c are at a substantially vertical angle relative to SPAD pixel 100 and its absorption region 108. In actual use, incidental light paths can be at a substantially obtuse angle, and microlens 102 is unable to redirect photons on such path to absorption region 108. For example, even though microlens 102 changes the direction of photons traveling along light path 101d, these photons still do not reach absorption region 108 as desired. It is to be appreciated that photons that do not reach absorption region 108 (e.g., traveling through light path 101d) are reflected by reflector arrays that are configured within the oxide region 113 of SPAD pixel 100.

SPAD pixel 100 includes two layers of reflector arrays. The first reflector array comprises reflectors 110a-110f as shown in FIG. 1. For example, reflectors 110a-110f are aligned relative to a first plane (e.g., an x-y plane). The second reflector array includes reflector 112a-e. It is to be noted that the "through gaps" are minimized between the two reflector arrays. For example, the gap between reflectors 110b and 110c are covered by reflector 112b. While there is a gap between reflectors 112b and 112c, the gap between reflectors 110c and 110d is minimized. For example, reflectors 112a-112e are aligned relative to a second plane (e.g., an x-y plane). For example, these reflectors comprise metal material, which can be made of a copper material, an aluminum material, a metal/oxide material, or a semiconductor material. In a specific embodiment, a copper material is used to implement reflectors, as copper is highly reflective for infrared (e.g., around 900 nm) light. In various embodiments, reflectors 110a-110f are characterized by a width of about 0.3 to 1 µm. The spacing between reflectors 110b-110e is about 0.14 to 1 µm; it is to be noted that spacing between reflector 110a and 110b is different, as reflector 110a is at the border region of SPAD pixel 100. Reflectors 112a-112e are characterized by a width of about 1 to 4 µm. The spacing between reflectors 112b-112d is about 0.1 to 1 µm; the spacing between reflector 112a and 112b is different because these two reflectors are close to the border region of SPAD pixel 100. The relative position between the first reflector array and the second reflector array is optimized to maximize the probability of photons being reflected to absorption region 108. The gaps between reflectors 110c-110d are substantially covered by reflector 112c, but the second reflector array does not cover gaps between 110b-110c.

It is to be appreciated that the array configuration of reflectors (with spacing between reflectors) in two layers provide better performance compared to conventional one-piece reflectors. For example, the spacing and arrangement of reflectors are associate with wavelength and potential diffraction grating effect. In various embodiments, SPAD pixel 100 is optimized for detecting infrared light (e.g., with a wavelength range of about 850 to 1000 nm). With widths and spacing that are less or equal to the wavelength of received photons, reflector array is more effective in light capture than one-piece reflectors. Reflectors 110a-f and 112a-e as shown are rectangular for exemplary purposes. In various embodiments, these reflectors have rounded corners to increase light reflection toward absorption region 108. In various embodiments, reflectors 110a-f and 112a-e have surfaces that are conducive to photons being reflected or scattered. For example, specific semiconductor manufacturing techniques may be used to ensure that that these surfaces are in a smooth matte finish.

FIG. 1B is a simplified top view diagram illustrating SPAD pixel 100 according to embodiments of the present invention. This diagram is merely an example, which should not unduly limit the scope of the claims. One of ordinary skill in the art would recognize many variations, alternatives, and modifications. SPAD pixel 100, as seen from the top view (i.e., viewing from the x-y plane), is in a substantially square shape, whose boundary is defined by isolation structures (i.e., 120 on the top, 122 on the bottom, 103 on the left, and 104 on the right). From sideview (i.e., viewing from the x-z plane), only isolation structures 103 and 104 can be seen, which respectively provide left and right boundaries of SPAD pixel 100, but isolation structures 120 and 122 (now visible as top and bottom boundaries of the SPAD pixel) were not shown in the sideview diagram in FIG. 1A. For example, the isolation structure 103, 104, 120, and 121 comprise DTI structures. Microlens 102 is configured around the border regions, overlying the silicon region 105 in FIG. 1A. Isolation structures 106 and 107 are respectively configured below isolation structures 103 and 104, and thus not visible from the top view. However, contact holes surround isolation structures 106 and 107 can be seen in FIG. 1B. For example, contact holes 109c and 109d surrounding isolation structure 107 are shown in FIG. 1B; they are among the array of contact holes where only two are visible at a time from the side view (e.g., as shown in FIG. 1A).

The first reflector array and the second reflectors array are shown in FIG. 1B as two-dimensional arrays. The first reflector array as shown includes a four-by-four array (reflectors in the first row includes 110b-110e); reflectors 110a and 110b (also part of the reflector array) that are positioned near the isolation structures are not shown in FIG. 1B. The first reflector array is positioned between the absorption region 108 in FIG. 1A and the second reflector array. The second reflector array includes a three-by-three array (reflectors 112b-d); reflectors 112a and 112b (also part of the reflector array) are positioned near the isolation structures are not shown in FIG. 1B. As shown, reflectors of the first reflector array are much bigger than the reflectors of the second reflector array. Depending on the implementation, the size and position of reflectors may be changed to maximize photon capture by absorption region 108.

Figure 2:
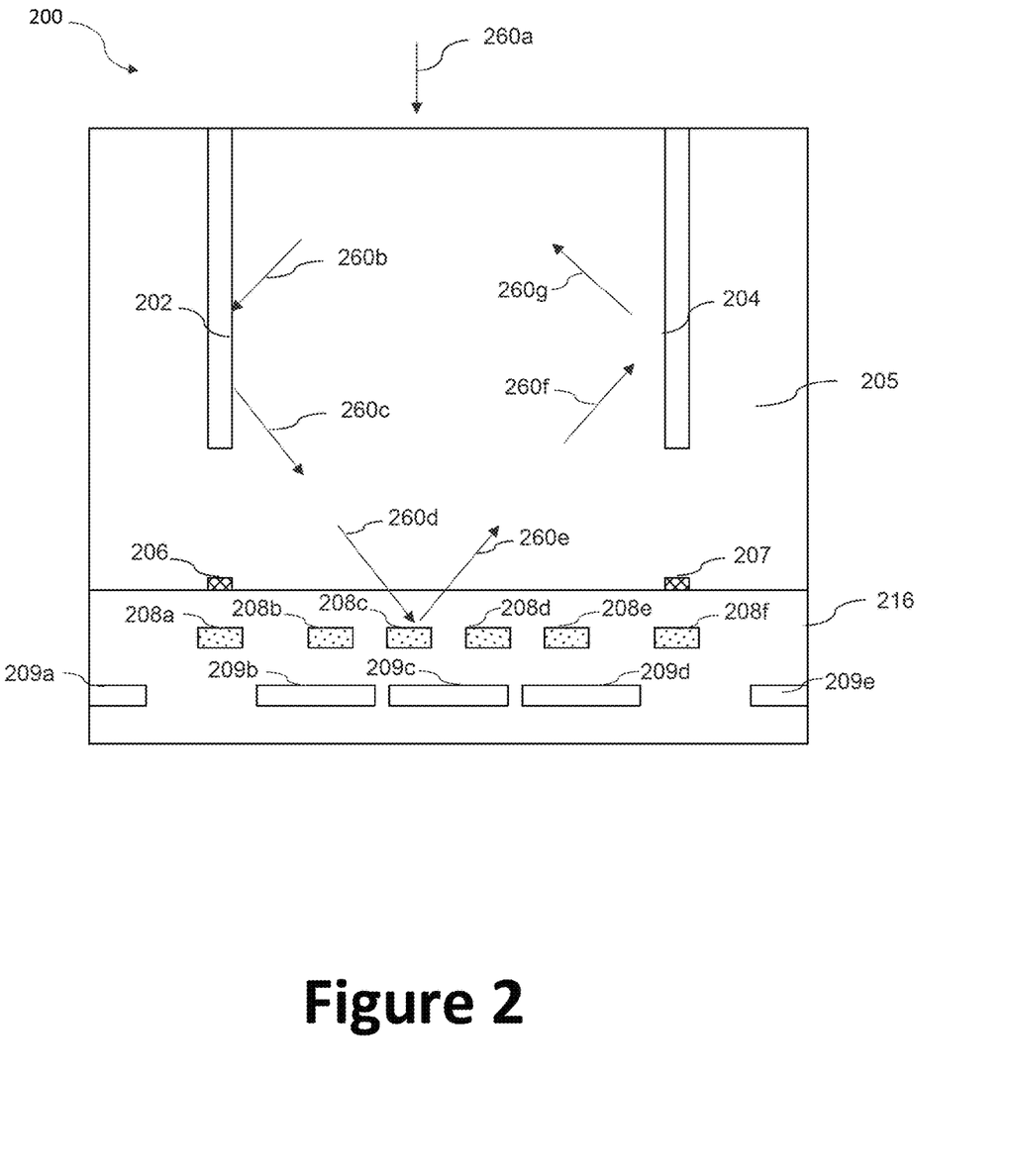
FIG. 2 is a simplified diagram illustrating light paths for SPAD pixel 200 according to embodiments of the present invention.

FIG. 2 is a simplified diagram illustrating light paths for SPAD pixel 200 according to embodiments of the present invention. This diagram is merely an example, which should not unduly limit the scope of the claims. One of ordinary skill in the art would recognize many variations, alternatives, and modifications. Once photons enter SPAD pixel 200, at least three structures maximize the probability of photons being detected by the absorption region. As an example, a photon following the light path of 260a is likely to directly reach the absorption region (not shown in FIG. 2) for detection, and if the photon pass through absorption region without detection, it is likely to be reflect by the first reflector array (i.e., reflectors 208a-208f) or the second reflector array (i.e., reflectors 209a-209e). A photon following light path 260b might bounce around a few times before detection by the absorption region. The photon could be reflected by isolation structure (e.g., DTI) 202 and follow light paths 260c and 260d (through silicon region 205). It is to be appreciated that without isolation structure 202, the photon traveling along light path 260b may undesirably travel to an adjacent SPAD pixel, thereby resulting in undesirable crosstalk. If the photon passes through the absorption region without detection, it is reflected by reflector 208c and travels through light path 260e. It to be noted that although there are spacings among reflectors 208a-208f, the first reflector array is more effective in reflecting photons than a single-piece reflector covering the same area. Reflectors 209a-e of the second reflector array have different area and spacing than reflectors 208a-208f. Effectiveness of reflector arrays can be attributed to various optical phenomenon, such as grating, dispersion, interference, and others. The photon traveling along light path 260e might be detected by the absorption region, but if not, it keeps going and follows light path 260f. Isolation structure 204 redirects the photon to light path 260g, and the photon might be reflected a few times internally within SPAD pixel 200 before detection by the absorption region.

Figure 3A:
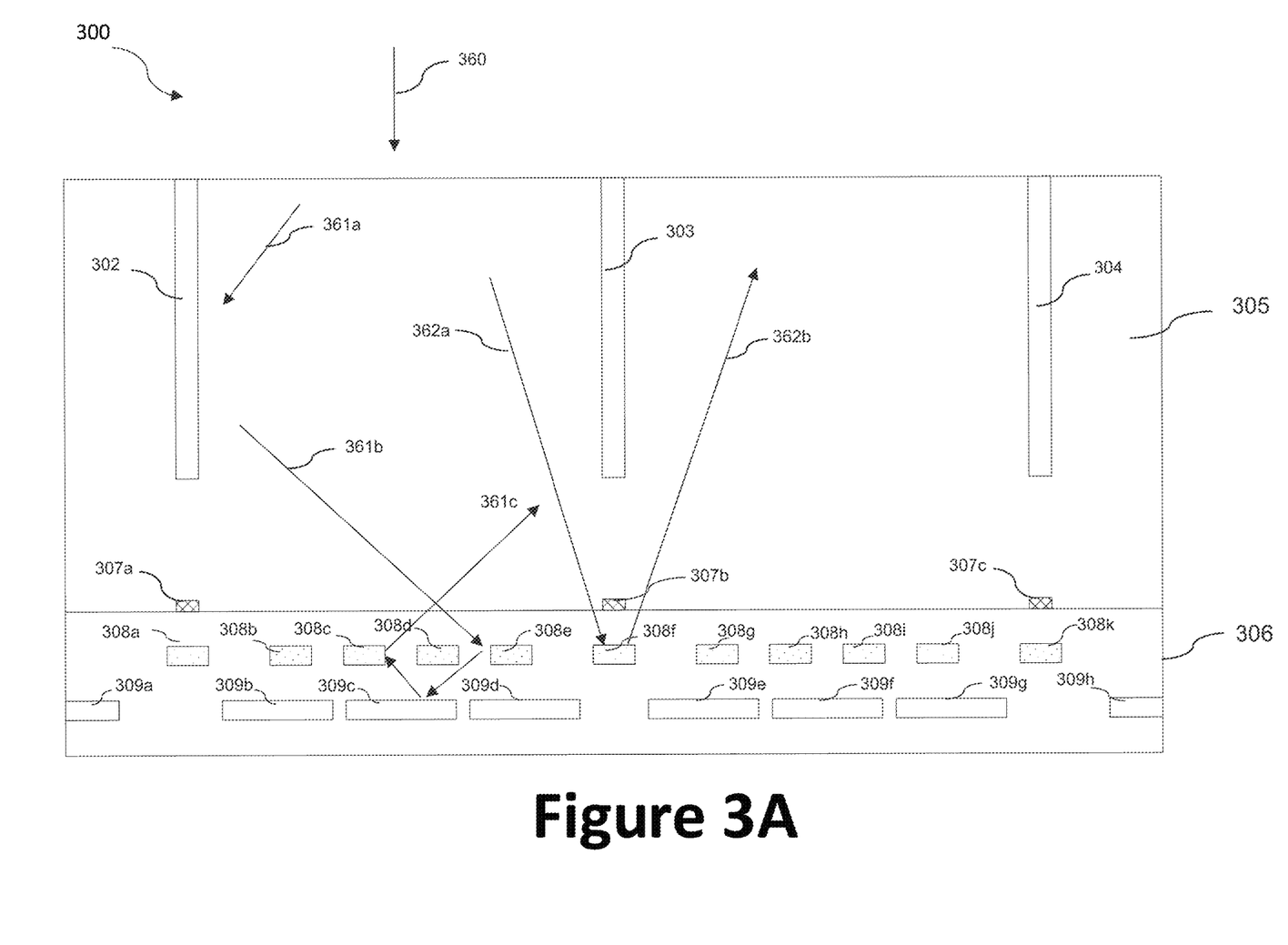
FIGS. 3A and 3B are simplified diagrams illustrating light paths for SPAD array 300 according to embodiments of the present invention.
Figure 3B:
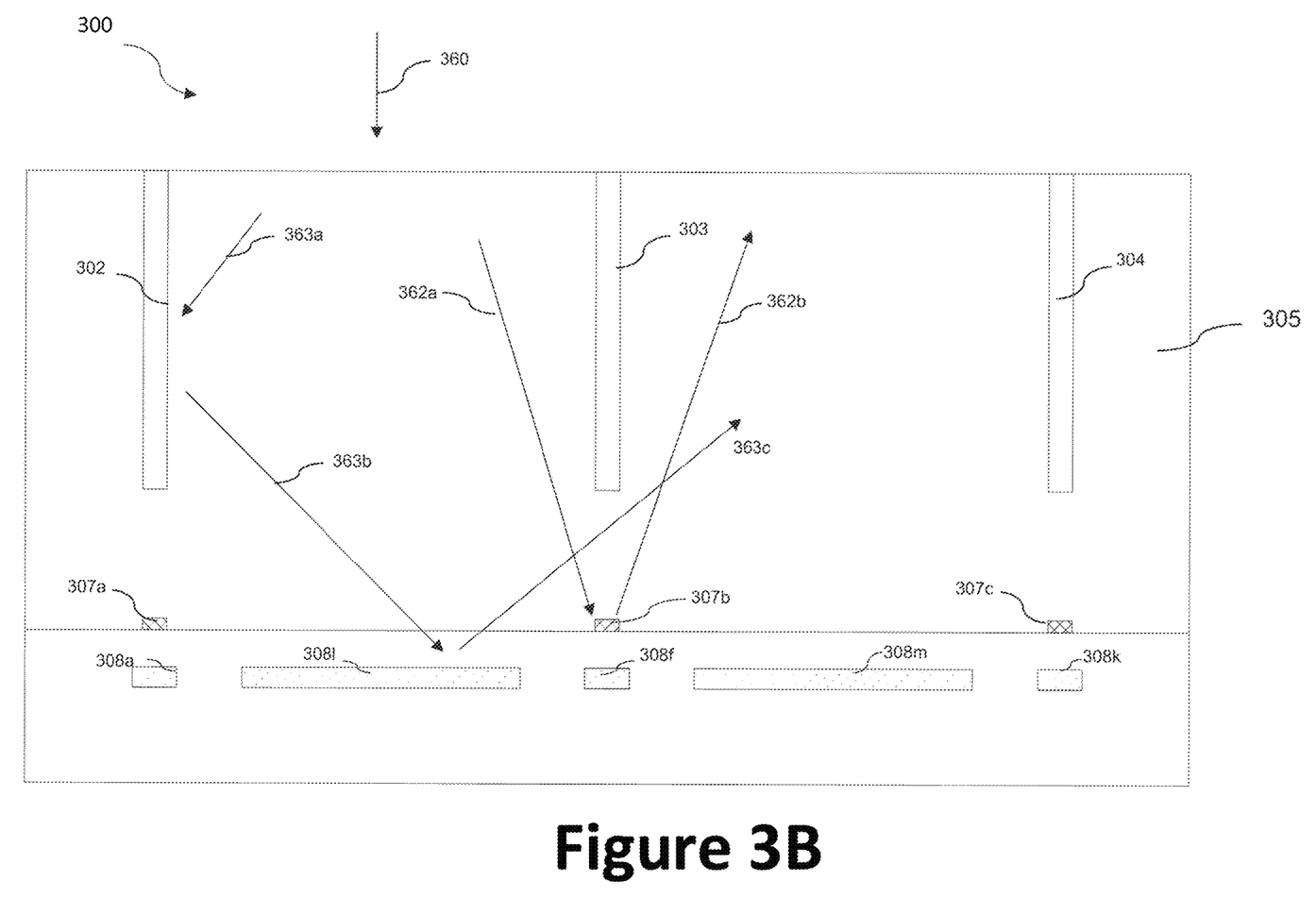

FIGS. 3A and 3B are simplified diagrams illustrating light paths for SPAD array 300 according to embodiments of the present invention. This diagram is merely an example, which should not unduly limit the scope of the claims. One of ordinary skill in the art would recognize many variations, alternatives, and modifications. SPAD array 300 includes two SPAD pixel: the first one on the left positioned between isolation structures 302 and 303, and the second one on the right positioned between isolation structures 303 and 304. Undesirable crosstalk of photons occurs when a photon entering one SPAD pixel travels to an adjacent SPAD pixel. For example, photons traveling through light path 360 is likely to be detected by the absorption region. However, photons traveling through light paths 361a or 362a could be reflected to the adjacent SPAD pixel. For example, a photon following light path 361a may be reflected off isolation structure 302 and then reflected again (if not detected by the absorption region) by reflector 308d to light path 362c.

While it is undesirable for this photon to go into the adjacent SPAD pixel, it is unlikely for this photon to be detected by the absorption region of this adjacent SPAD pixel, as light path 362c is likely to lead the photon toward isolation structure 304. As another example, a photon following light path 362a bounces off reflector 308f and follows light path 362b; while it is undesirable for the left SPAD pixel to "miss" this photon, it is unlikely for the right SPAD pixel to incorrectly detect this photon, as the photon is likely to exit the right SPAD pixel through light path 362b. In various embodiments, isolation structures and reflectors are configured as such that even though a photon may travel—undesirably—from a first SPAD pixel to a second SPAD pixel, this photon is unlikely to be detected by the absorption region of the second pixel.

Figure 4A:
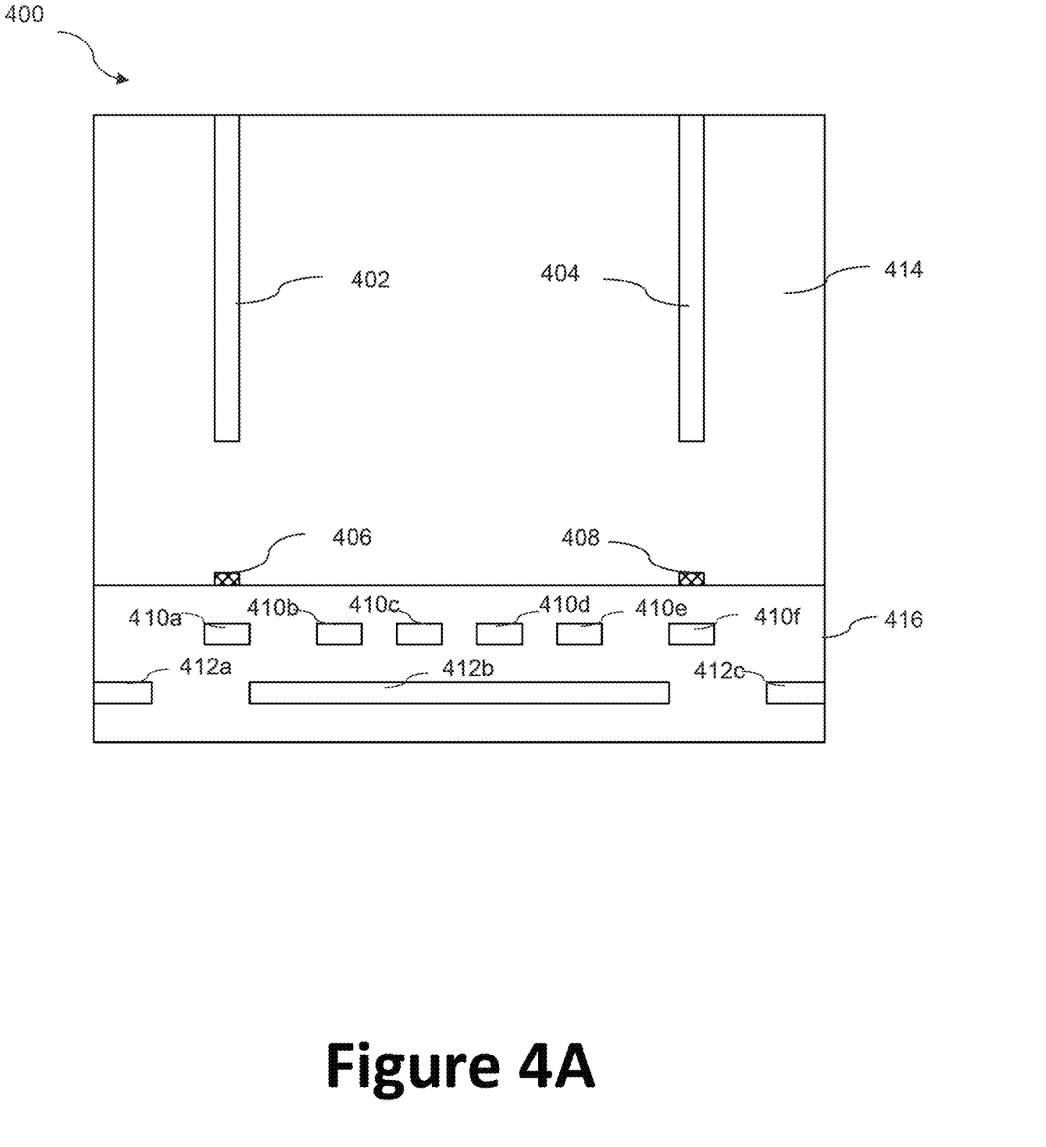
FIG. 4A is a simplified side view diagram illustrating SPAD pixel 400 according to embodiments of the present invention.

FIG. 4A is a simplified sideview diagram illustrating SPAD pixel 400 according to embodiments of the present invention. This diagram is merely an example, which should not unduly limit the scope of the claims. One of ordinary skill in the art would recognize many variations, alternatives, and modifications. SPAD pixel 400 includes isolation structures 402 and 404 that function as boundaries, and they can be structured to reflect incoming photons and to prevent them from traveling to adjacent SPAD pixel. For example, isolation structures 402 and 404 may comprise DTI or others. Isolation structures 406 and 408 are aligned relative to isolation structures 402 and 404. For example, isolation structures 402 and 404 comprise STI. In various embodiments, these isolation structures are positioned within the silicon region 414 of SPAD pixel 400. SPAD pixel 400 also includes an oxide region 416 (e.g., a region comprising silicon oxide material). Two reflector arrays are configured within oxide region 416. The first reflector array comprises reflectors 410a to 410f as shown. The second reflector array comprises reflectors 412a, 412b, and 412c. In various embodiment, reflectors 410a to 410f are characterized by a width of about 300 nm, and the spacing between these reflectors is about 1 μm. For example, reflectors 410a to 410f comprise metal material and they may include matte-finished top surfaces contribute by a high level of light scattering. As explained above, it is to be appreciated that the first reflector array (i.e., including reflectors 410a to 410f) is more effective in reflecting photons and preventing photon cross talk than a single-piece reflector occupying the same area. For example, the configuration of reflector array is optimized for reflecting infrared light with a wavelength of about 800 to 1000 nm. The second reflector array is configured below the first reflector array. In various embodiments, reflector 412b is much large than individual reflectors of the first reflector array. For example, reflector 412b is characterized by a width of more than 5 μm. In various embodiments, the width of reflector 412b is configured to be greater the space occupied by reflectors 410b to 410e.

Figure 4B:
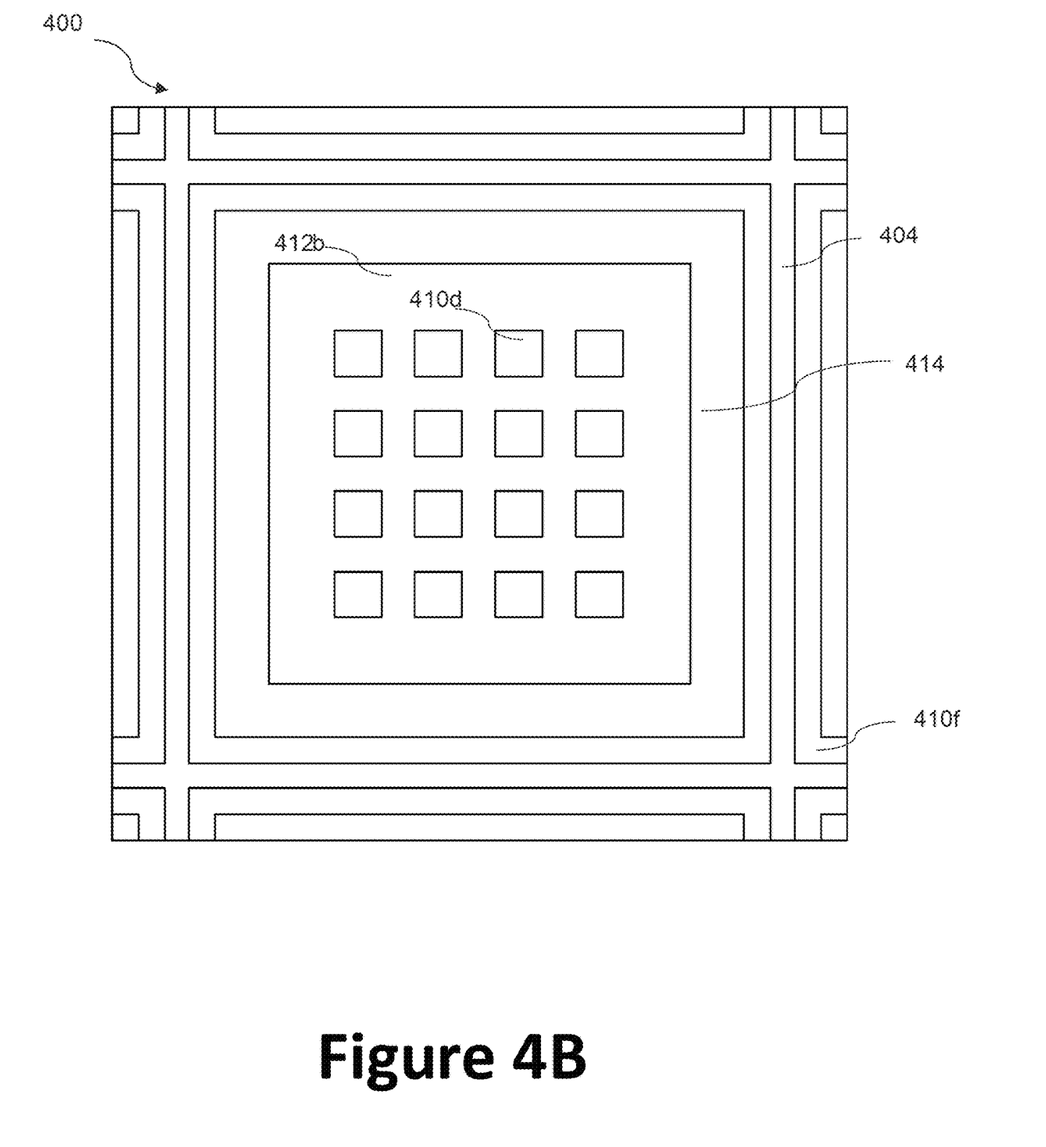
FIG. 4B is a simplified top view diagram illustrating SPAD pixel 400 according to embodiments of the present invention.

FIG. 4B is a simplified top view diagram illustrating SPAD pixel 400 according to embodiments of the present invention. This diagram is merely an example, which should not unduly limit the scope of the claims. One of ordinary skill in the art would recognize many variations, alternatives, and modifications. SPAD pixel 400, as shown from the top view, is bordered by isolation structure (including isolation structure 404). Reflector 412b is a part of the second reflector array, and a four-by-four reflector array (including reflector 410d as shown) is configured within the area of reflector 412b. Among other things, reflector 412b reflects photons—not detected by the absorption region nor reflected by the first reflector array—back to the absorption region of the SPAD pixel 400.

Figure 5A:
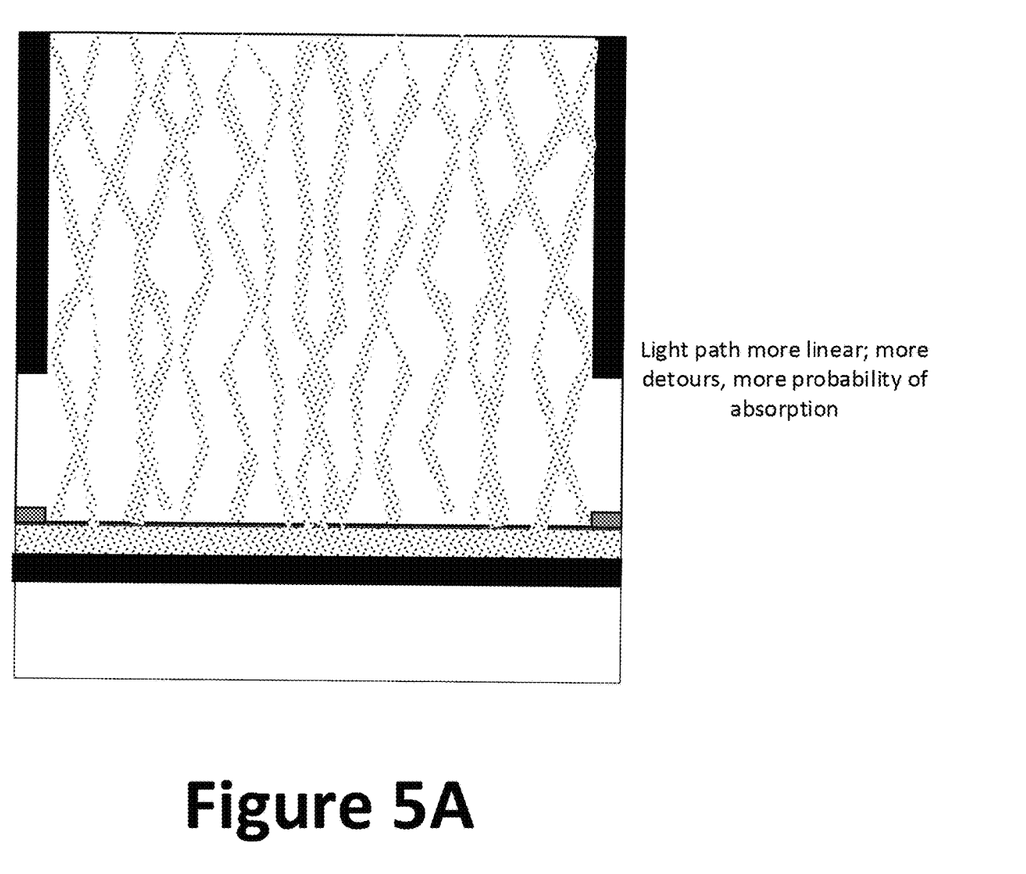
FIGS. 5A and 5B are diagram comparing electric fields of light entering a SPAD pixel according to embodiments of the present invention.
Figure 5B:
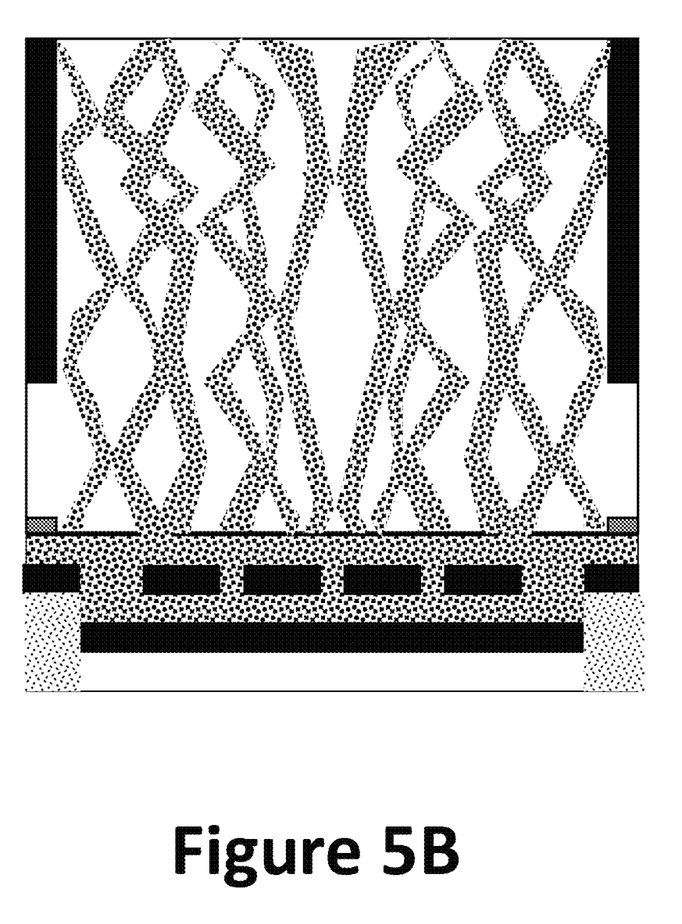

FIGS. 5A and 5B are diagram comparing electric fields of light entering a SPAD pixel according to embodiments of the present invention.

While the above is a full description of the specific embodiments, various modifications, alternative constructions and equivalents may be used. Therefore, the above description and illustrations should not be taken as limiting the scope of the present invention which is defined by the appended claims.

What is claimed is:
1. An image pixel circuit comprising:
a first semiconductor region;
a second semiconductor region overlaying the first semiconductor region;
a microlens overlaying the second semiconductor region;
a first isolation structure positioned within the second semiconductor region;
a second isolation structure positioned within the second semiconductor region, the second isolation structure being aligned relative to the first isolation structure in a first direction;
an absorption region positioned within the second semiconductor region and overlaying the first semiconductor region;
a first plurality of reflectors positioned within the first semiconductor region, the absorption region being positioned between the microlens and the first plurality of reflectors; and
a second plurality of reflectors positioned between the first plurality of reflectors and the absorption region, the second plurality of reflectors being substantially parallel to the first plurality of reflectors.

2. The circuit of claim 1 wherein the first semiconductor region comprises oxide material.

3. The circuit of claim 2 wherein the first plurality of reflectors and the second plurality of reflectors are configured in the oxide material.

4. The circuit of claim 1 wherein the second plurality of reflectors is characterized by a first reflector width of about 0.3 to 1 μm.

5. The circuit of claim 4 wherein the first plurality of reflectors is characterized by a second reflector width of about 1 to 8 μm.

6. The circuit of claim 1 further comprising a third isolation structure aligned relative to the first isolation structure in a second direction, the first isolation structure comprising a deep trench isolation, the third isolation structure comprising a shallow trench isolation.

7. The circuit of claim 6 further comprising contact holes positioned adjacent to the third isolation structure.

8. The circuit of claim 1 wherein the first isolation structure comprises an air gap region.

9. The circuit of claim 1 wherein the second semiconductor region comprises silicon material.

10. The circuit of claim 1 further comprising a passivation region overlaying the second semiconductor region, the microlens comprising a convex surface and a flat surface, the flat surface being attached to the passivation region.

11. An image pixel circuit comprising:
a first isolation structure;
a second isolation structure;
an aperture region positioned between the first isolation structure and the second isolation structure;
an oxide region configured between the first isolation structure and the second isolation structure;
an absorption region overlaying the oxide region;

a first plurality of reflectors, the absorption region being positioned between the aperture region and the first plurality of reflectors; and a second plurality of reflectors positioned between the first plurality of reflectors and the absorption region.

12. The circuit of claim 11 further comprising a microlens aligned relative to the first isolation structure and the second isolation structure.

13. The circuit of claim 11 wherein the second isolation structure comprises a deep trench isolation.

14. The circuit of claim 11 wherein the first plurality of reflectors and the second plurality of reflectors are positioned in the oxide region.

15. The circuit of claim 11 further comprising an electrical contact.

16. The circuit of claim 11 wherein the first plurality of the reflectors and the second plurality of reflectors are substantially parallel.

17. An image pixel circuit comprising:
a first isolation structure;
a second isolation structure;
an oxide region configured between the first isolation structure and the second isolation structure;
an absorption region overlaying the oxide region;
a first plurality of reflectors positioned within the oxide region, the first plurality of reflectors being configured to reflect photons to the absorption region; and
a second plurality of reflectors positioned within the oxide region, the second plurality of reflectors being configured to reflect photons to the absorption region, the second plurality of reflectors being substantially parallel to the first plurality of reflectors.

18. The circuit of claim 17 wherein the second isolation structure is aligned relative to the first isolation structure.

\* \* \* \* \*